(12) United States Patent
Furukawa et al.

(10) Patent No.: US 6,452,265 B1
(45) Date of Patent: Sep. 17, 2002

(54) MULTI-CHIP MODULE UTILIZING A NONCONDUCTIVE MATERIAL SURROUNDING THE CHIPS THAT HAS A SIMILAR COEFFICIENT OF THERMAL EXPANSION

(75) Inventors: Toshiharu Furukawa, Essex Junction, VT (US); Mark C. Hakey, Fairfax, VT (US); Steven J. Holmes, Milton, VT (US); David V. Horak, Essex Junction, VT (US); Rosemary A. Previti-Kelly, Burlington, VT (US); Edmund Sprogis, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/493,929

(22) Filed: Jan. 28, 2000

(51) Int. Cl.⁷ .............................................. H01L 23/34
(52) U.S. Cl. ....................................................... 257/723
(58) Field of Search .................................. 257/723, 724, 257/777, 734, 738, 780, 700, 701, 729, 758, 779, 788, 795, 778; 438/15, 107, 125, 108, 622, 126, 127

(56) References Cited

U.S. PATENT DOCUMENTS

| | | | |
|---|---|---|---|
| 4,630,096 A | 12/1986 | Drye et al. .................. 257/777 |
| 4,866,507 A | 9/1989 | Jacobs et al. ................ 257/659 |
| 5,008,213 A * | 4/1991 | Kolesar, Jr. .................. 438/107 |
| 5,063,177 A * | 11/1991 | Geller et al. ................. 438/107 |
| 5,250,843 A | 10/1993 | Eichelberger ................ 257/692 |
| 5,373,627 A | 12/1994 | Grebe .......................... 29/841 |
| 5,455,455 A | 10/1995 | Badehi ......................... 257/690 |
| 5,506,753 A | 4/1996 | Bertin et al. .................. 361/705 |
| 5,539,218 A | 7/1996 | Takahama et al. ........... 257/788 |
| 5,753,959 A | 5/1998 | Quinn et al. ................. 257/443 |
| 5,793,117 A * | 8/1998 | Shimada et al. ............. 257/780 |
| 5,801,452 A | 8/1998 | Farnworth et al. ........... 257/797 |
| 5,851,845 A | 12/1998 | Wood et al. .................. 438/15 |
| 6,294,403 B1 * | 9/2001 | Joshi ........................... 438/106 |

* cited by examiner

*Primary Examiner*—David L. Talbott
*Assistant Examiner*—Alonzo Chambliss
(74) *Attorney, Agent, or Firm*—Whitham, Curtis & Christofferson, P.C.; Mark F. Chadurjian

(57) ABSTRACT

A multi-chip module is constructed by aligning prewired chips on a support wafer and depositing a nonconductive thermally conductive and electrically nonconductive material having a coefficient of thermal expansion that approximate that of the chips (e.g. silicon, silicon carbide, silicon germanium, germanium or SiCGe) to surround chips. After removal of the support wafer, processing of multi-chip module is finished with wiring on a shared surface of multi-chip module and chip surface.

8 Claims, 2 Drawing Sheets

MULTI-CHIP MODULE UTILIZING A NONCONDUCTIVE MATERIAL SURROUNDING THE CHIPS THAT HAS A SIMILAR COEFFICIENT OF THERMAL EXPANSION

BACKGROUND OF THE INVENTION

1. Field of the Invention

The present invention generally relates to manufacture of multi-chip modules for semiconductor substrates and more particularly to filling gaps between chips on a module.

2. Background Description

It is desirable to wire separate chips into a single multi-chip module, while maintaining wiring density, in order to achieve a high level of integration without degrading product yield. When multiple chips are combined into a single unit, it is generally required to bind them with filler on the sides and/or front and back faces of the chips. The wiring material connecting the chips generally passes across or through this filler material. If the thermal expansion coefficient of the filler is different from that of the chips, the wires can become stressed, causing reliability fails, as a result of temperature fluctuations. Also, the filler materials are generally thermally non-conductive, and can act as a barrier to the cooling of the chips in the multi-chip module.

Currently, there is much interest in creating "system-on-a-chip" solutions for different applications. The chip would include, in many cases, logic functions, and dynamic random access memory (DRAM) functions. It is difficult to integrate DRAM with logic function because they require different types of patterns and processes. Often, one must compromise on the performance of the logic and the performance/density of the memory in order to integrate them into a single chip. The use of a multi-chip module, would allow the logic and memory to be built separately, with processes optimized for each, and then combined into a single chip at the wiring levels. In an effort to combine logic and memory functions into a single chip, the chips often become very large, and the yield of the chips is very low. If the memory and logic chips are built separately, with smaller die sizes, the yields can be greatly enhanced. Then, the separate, small chips can be integrated into a single module at the wiring level.

SUMMARY OF THE INVENTION

It is therefore an object of the present invention to provide a means of matching the thermal expansion properties of the chips on a multi-chip module, and to provide a means of dissipating heat from the multi-chip module.

It is also an object of the present invention to provide a multi-chip module in which chips of different technologies can be mounted together.

The invention is a base structure on which a plurality of integrated circuit chips are mounted, the chips being electrically interconnected by conductive structures and having a given coefficient of thermal expansion. The base structure is comprised of a material that is thermally conductive, substantially electrically nonconductive, and has a coefficient of thermal expansion that approximates that of the chips.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
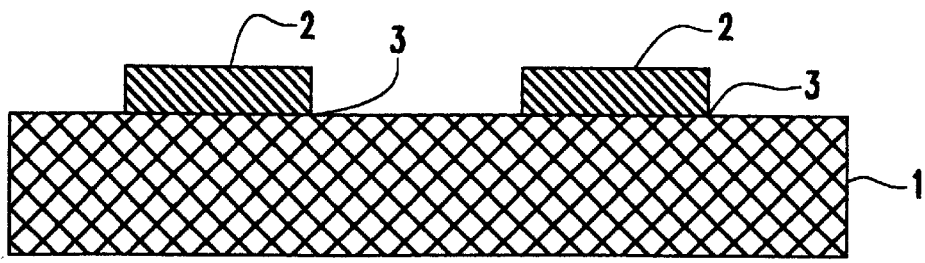
FIGS. 1A, 1B, 1C, and 1D are cross-sectional views showing the steps of the construction of the multi-chip module.

Referring now to the drawings, and more particularly to FIG. 1A, there is shown the first step in preparing the inventive structure. A template or alignment wafer 1 is prepared for support and alignment, as in the Precision Aligned Macro (PAM) process. The PAM process requires coating a photosensitive polyimide on a silicon wafer, exposing the polyimide, and developing the exposed pattern. The photosensitive polyimide may be between 1–50 microns thick, preferably 10–15 microns thick. The pattern consists of a chip the same size as the chip which will be assembled into the align wafer pattern. Within the chip there may be a series of 45° angled lines/spaces across one quadrant and an orthogonal array of pegs, which will serve as the alignment and lock keys. The polyimide pattern is thermally cured at 350° C. for one hour. A complementary pattern of angled lines on the front face of the chips to be formed into the PAM structure is formed. A layer of preferably 10 microns of photosensitive polyimide is applied on the wafer of chips to be patterned. A complementary alignment key is created by exposing and developing the complementary line/space pattern in polyimide on the chips. The polyimide pattern is cured at 350° C. for one hour and chips are diced.

The diced chips 2 are placed face down onto the template wafer 1 such that the respective polyimide patterns interlock, holding the chips in place on the template, aligned to one another by the polyimide patterns described above. The placement of chips can be done by manual placement or with an automatic chip replacement tool, such as is supplied by ISIS. The polyimide patterns provide for the reproducibility of device construction so that variation does not occur in placement of chips on the alignment wafer. An angled array of lines and spaces, printed in polyimide in which the lines range from 1 mm to 25 mm in length, with the width of the lines being about 2 to 15 microns, preferably about 8 microns, and the width of the spaces being also in the same range, and being chosen of appropriate width to allow the complementary lines of the chip/template alignment keys to interlock. The thickness of the polyimide is about 2–15 microns, preferably about 8 microns. A thin layer of thermally release-able glue 3, such as an epoxy, is used to temporarily bind the chips 2 to the template wafer 1.

Figure 1B:
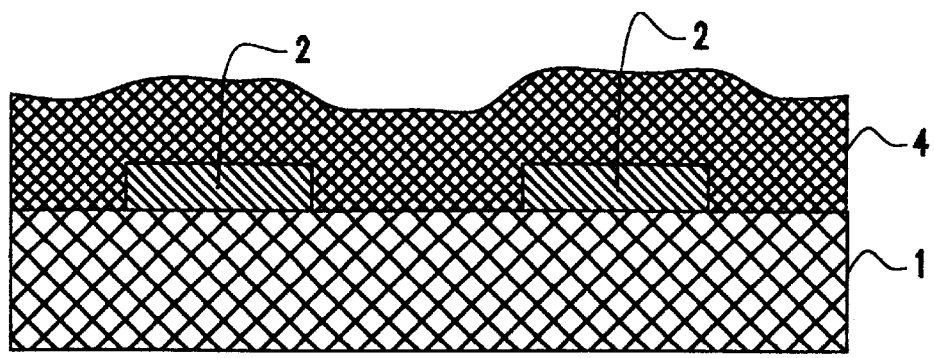
Figure 1C:
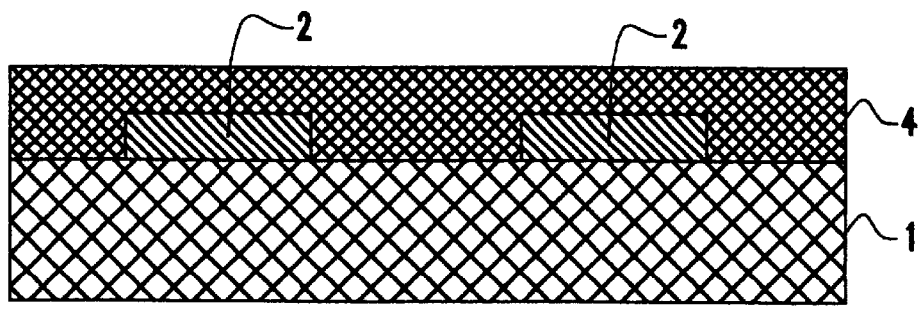

Next, as shown in FIG. 1B, the template wafer 1 with attached chips 2 is placed in a film deposition tool and amorphous silicon is deposited to provide layer 4, which reconstitutes the diced chips into a new substrate wafer, at 100° C. with silane gas (or methylsilane, disilane or similar derivatives). A Jet Vapor deposition tool or plasma chemical vapor deposition tool may be used to deposit this amorphous silicon on the backsides of the aligned chips and the spaces there between. The deposition thickness should be in the range of 100–500 microns, preferably about 300 microns. After deposition, the deposited silicon can be planarized by chemical mechanical polish or other techniques. In addition to silicon, silicon carbide, silicon germanium, germanium, or SiCGe may be used. Silicon is preferable for limiting thermal expansion stress problems when chips 2 are silicon based. Thus, for example, silicon germanium would be a good material to use for layer 4 when the chips are SiGe-based.

Figure 1D:
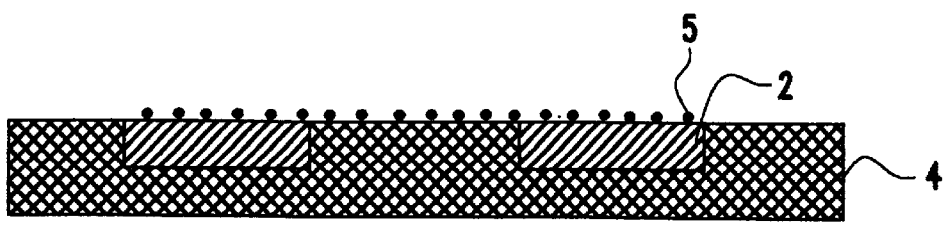

Then the template wafer 1 is released by baking at a temperature sufficient to degrade the glue 3. For example, a 350° C. baking temperature should decompose the epoxy glue 3. The faces of the bonded chips are cleaned with an oxygen plasma. Alternatively, a chemical-mechanical polish can be used to clean the faces of bonded chips. Polishing is more compatible with copper metallization, due to the plasma process. Finally, as shown in FIG. 1D, a wiring level 5 is created between the bonded chips 2, with standard metallization processing, to create the multi chip modules. In practice, this structure would be a conventional insulator/metallization interconnect structure in which metal extends through insulator vias to interconnect selected integrated circuit structures on the chips 2. While a single wiring level is shown, in practice the chips would be interconnected using multiple wiring layers.

The structure shown in FIG. 1D approximates a wafer with multiple chips therein, where the wafer is made in reverse. The integrated circuit chips have a thermally conductive material therebetween which has a coefficient of thermal expansion that approximates the adjacent integrated circuit chips, so that substantial mechanical stresses are not imparted on the chips or the wiring layers. However, to electronically isolate devices on the integrated circuit chips the thermally conductive material is substantially electrically nonconductive. Electrical connections between chips in the structure will be established by circuitry extending over the material between the chips. Note that the upper surfaces of the chips 2 and surrounding portions of material 4 are substantially coplanar, which optimizes the density of the subsequent wiring layers 5.

Examples of the alignment keys discussed above are shown more clearly in FIGS. 2A and 2B. However, it should be understood that other mechanisms for aligning chips in a manner which allows reliable over coating and filling to produce a structure as shown in FIG. 1D could also be used within the practice of this invention.

Figure 2A:
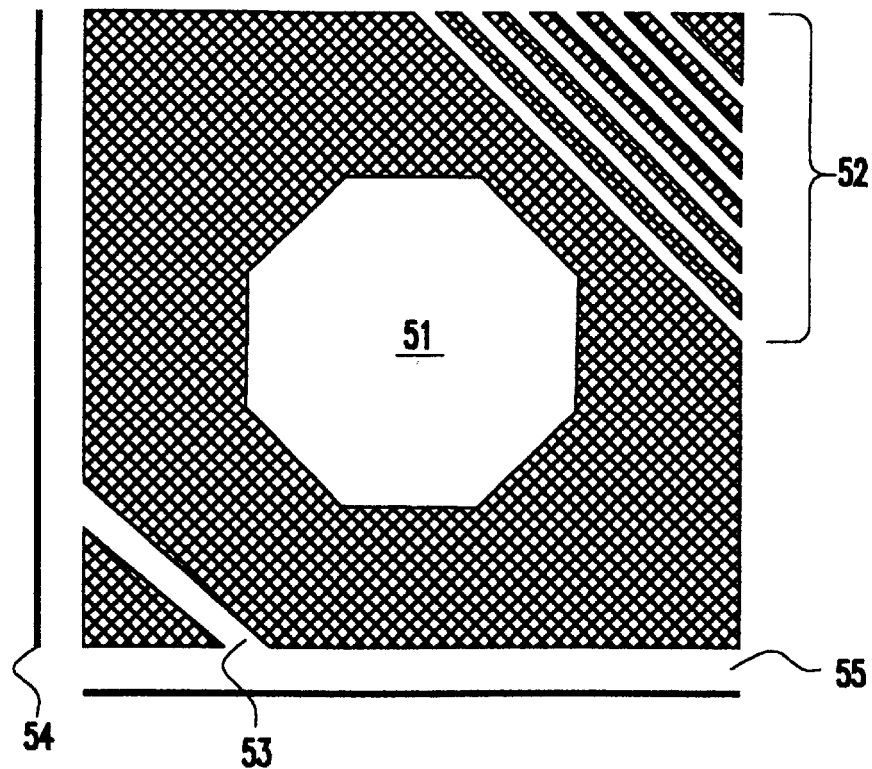
FIG. 2A is a plan view of an alignment key having an orthogonal pattern.

FIG. 2A has a pattern referred to here as "LV1" having an orthogonal cut out 51 and a series of etched 45° angled lines 52 in an upper corner. Additionally, there is a single wide 45° line 53 in a lower corner and a vertical 54 and horizontal 55 edge line leading away from the wide line 53.

Figure 2B:
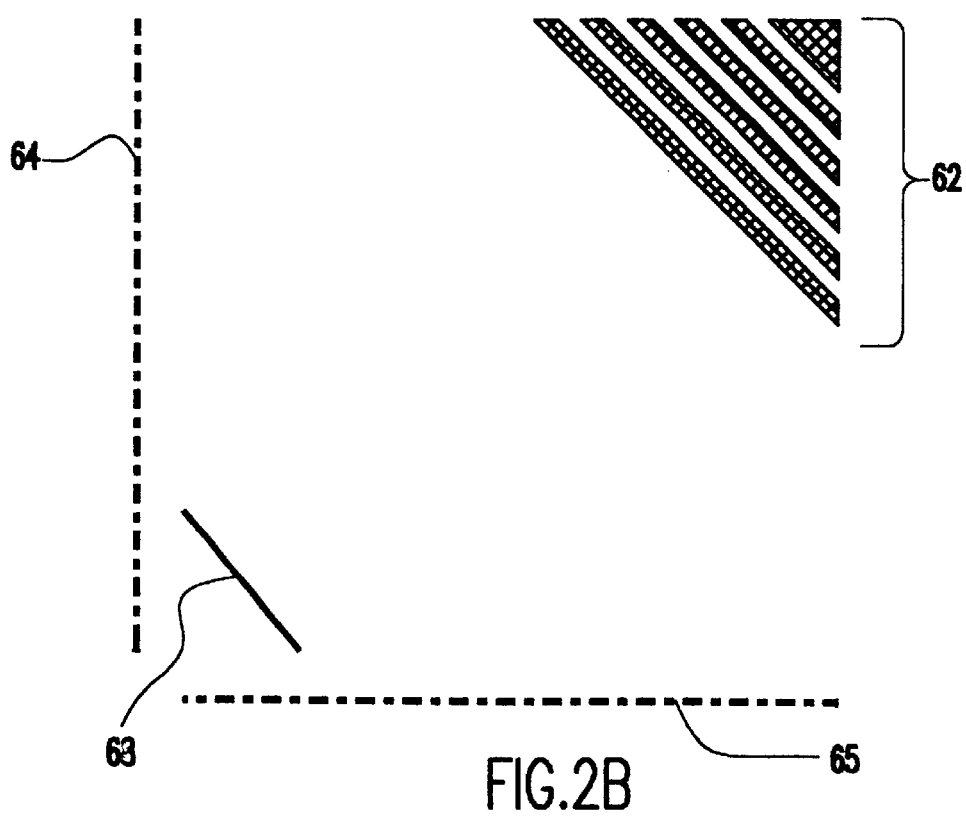
FIG. 2B is a plan view of an alignment key having a 45° diagonal line pattern.

FIG. 2B has a pattern referred to here as "LV2". This pattern will fit into the LV1 pattern. Raised 45° angled lines 62 will match etched angled lines 52, wide raised 45° line 63 will match wide line 53, and raised vertical 64 and horizontal 65 edges will match vertical 54 and horizontal 55 edge line. In practice, chips to be mounted in a multi-chip module will have all the same pattern. As part of processing the key or pattern type will be exposed. A complementary key or pattern type will be exposed on the alignment wafer. So that if the key type on the chips is LV1 as shown in FIG. 2A the key type on the alignment wafer is LV2 as shown in FIG. 2B. Thus, when building the multi-chip module, the chips can be interlocked to a specific space on the alignment wafer.

While the invention has been described in terms of its preferred embodiments, those skilled in the art will recognize that the invention can be practiced with modification within the spirit and scope of the appended claims.

We claim:
1. An electronic structure, comprising:
   a base structure on which a plurality of integrated circuit chips are mounted, the chips being elerically interconnected by conductive structures and each having a given coefficient of thermal expansion, the base structure being deposited on and surrounding said plurality of integrated circuit chips and being comprised of a material that is:
   thermally conductive;
   non-single crystalline;
   substantially electrically nonconductive; and
   has a coefficient of thermal expansion that approximates that of the chips.
2. An electronic structure as in claim 1, wherein said material is selected from the group consisting of silicon, silicon carbide, silicon germanium, germanium, and SiCGe.
3. An electronic structure, comprising:
   a plurality of integrated circuit chips, each having first and second side faces and a plurality of end faces, and having a given coefficient of thermal expansion; and
   a nonconductive, non-single crystalline material deposited onto and overlaying one of said first and second side faces and substantially overlaying said plurality of end faces of said plurality of integrated circuit chips, said nonconductive material having a coefficient of the expansion similar to said given coefficient of thermal expansion of said plurality of integrated circuit chips.
4. A multi-chip module comprising:
   a plurality of wired integrated circuit chips, each of said integrated circuit chips surrounded on a bottom surface and any side surfaces by a non-single crystalline, semiconductive material deposited on said integrated circuit chips;
   a top surface of said material being continuous with a top surface of each of said plurality of said integrated circuit chips; and
   a wiring level on said at least one continuous surface.
5. A multi-chip module as in claim 4, wherein said material has a coeffcient of thermal expansion approximately equal to a coefficient of thermal expansion of said plurality of wired integrated circuit chips.
6. A multi-chip module as in claim 4, wherein said material is selected from the group consisting of silicon, silicon carbide, silicon germanium, germanium, and SiCGe.
7. A multi-chip module as in claim 4, wherein said material is silicon.
8. An electronic structure, comprising:
   a base structure on which a plurality of integrated circuit chips are mounted, the chips being electrically interconnected by conductive structures, the base structure being deposited on and surrounding said plurality of integrated circuit chips other than an upper surface thereof, and being comprised of an amophous silicon material that is:
   thermally conductive; and
   does not impart substantial mechanical stress to said conductive structures.

* * * * *